(12) United States Patent
Zanuccoli et al.

(10) Patent No.: US 6,288,603 B1
(45) Date of Patent: Sep. 11, 2001

(54) HIGH-VOLTAGE BIDIRECTIONAL SWITCH MADE USING HIGH-VOLTAGE MOS TRANSISTORS

(75) Inventors: Mauro Zanuccoli, Cesenatico; Roberto Canegallo, Tortona; Davide Dozza, Villanova, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/595,680

(22) Filed: Jun. 16, 2000

(51) Int. Cl.[7] .................................................. G05F 3/02
(52) U.S. Cl. ............................ 327/544; 327/534; 327/546
(58) Field of Search .................................. 327/111, 112, 327/333, 374, 387, 388, 389, 390, 427, 451, 544, 546

(56) References Cited

U.S. PATENT DOCUMENTS

| 4,595,847 | 6/1986 | Weir | 327/382 |
| 5,319,604 | * 6/1994 | Imondi et al. | 327/536 |
| 5,585,650 | 12/1996 | Kumagai | 257/124 |
| 5,723,985 | 3/1998 | Van Tran et al. | 326/81 |
| 5,925,905 | 7/1999 | Hanneberg et al. | 257/299 |
| 5,973,552 | * 10/1999 | Allan | 327/544 |

OTHER PUBLICATIONS

Svensson, L.J., et al., "Driving Capacitive Load without Dissipating $fCV^2$," IEEE Symposium on Low Power electronics, Marina del Ray, CA., 1994, pp. 100–101.

* cited by examiner

Primary Examiner—Kenneth B. Wells
Assistant Examiner—Paul Dinh
(74) Attorney, Agent, or Firm—Theodore E. Galanthay; Robert Iannucci; Seed IP Law Group PLLC

(57) ABSTRACT

The high-voltage bidirectional switch includes a controlled transistor having a first terminal and a second terminal set, respectively, at a first potential and at a second potential. The controlled transistor moreover includes a control terminal connected to a control block, which is in turn connected to a precharge block The controlled transistor has its bulk region connected to a biasing block which is in turn connected both to the precharge block and to the second terminal of the controlled transistor. The control block and the biasing block are moreover connected to a signal-generator block connected to a control unit.

9 Claims, 4 Drawing Sheets

HIGH-VOLTAGE BIDIRECTIONAL SWITCH MADE USING HIGH-VOLTAGE MOS TRANSISTORS

TECHNICAL FIELD

The present invention regards a high-voltage bidirectional switch made using high-voltage MOS transistors.

BACKGROUND OF THE INVENTION

As is known, some integrated electronic devices comprise circuit parts which, albeit co-operating together, operate with different voltage levels and hence must be supplied separately. In this connection, in various integrated electronic devices, such as voltage-boosting devices used in storage devices, converter devices, power-supply devices and the like, high-voltage bidirectional switches are used that transfer voltages higher than the supply voltage between the various circuit parts that make up these devices. High-voltage bidirectional switches are also used to transfer charge between high-voltage capacitors.

According to a known solution described in the patent U.S. Pat. No. 4,595,847, in order to produce a high-voltage bidirectional switch the use of a pair of depletion MOS transistors is envisaged, said transistors having their respective source terminals connected together and their respective gate terminals connected together. The bidirectional switch thus made conducts when the voltage present between the common gate terminal and the common source terminal of the pair of MOS transistors is higher than the pinch-off voltage of the channel regions of the transistors themselves.

However, this known solution presents the drawback that it is somewhat complex to implement, and hence costly.

Also known are high-voltage bidirectional switches made using voltage-level translator devices.

Also this known solution presents disadvantages in that voltage-level translator devices have a high degree of dissipation in dynamic state.

SUMMARY OF THE INVENTION

A purpose of the present invention is to provide a high-voltage bidirectional switch comprising a pass gate having a control terminal; a first line and a second line set, respectively, at a first reference potential and at a second reference potential; a first MOS switch connected between said first line at said first reference potential and said control terminal, and having a control terminal of its own connected to a first node and receiving a control voltage, said first MOS switch being closed in the presence of a first value and open in the presence of a second value of said control voltage; a second MOS switch connected between said second line at said second reference potential and said control terminal, and having a control terminal of its own; a first memory circuit including MOS transistors and having an activation input, and an output connected to said first node, said memory circuit generating said first value of said control voltage; a second memory circuit including MOS transistors and having an activation input, and an output connected to said first node, said second memory circuit generating said second value of said control voltage; a control unit sending in sequence and cyclically: a first pulse signal to said activation input of said first memory circuit to control temporary activation of said memory circuit, storage of said first value of said control voltage on said first node, connection of said control terminal of said pass gate to said first line at a first reference potential, and storage of said first reference potential on said control terminal of said pass gate; a second pulse signal to said activation input of said second memory circuit to control temporary activation of said second memory circuit, and storage of said second value of said control voltage on said first node; and a third pulse signal to said second MOS switch to control temporary closing of said second MOS switch, and storage of said second value of said control voltage.

The characteristics and advantages of the high-voltage bidirectional switch according to the present invention will emerge from the ensuing description of an example of embodiment, which is given merely to provide a nonlimiting illustration, with reference to the attached drawings.

DETAILED DESCRIPTION OF THE INVENTION

Figure 1:
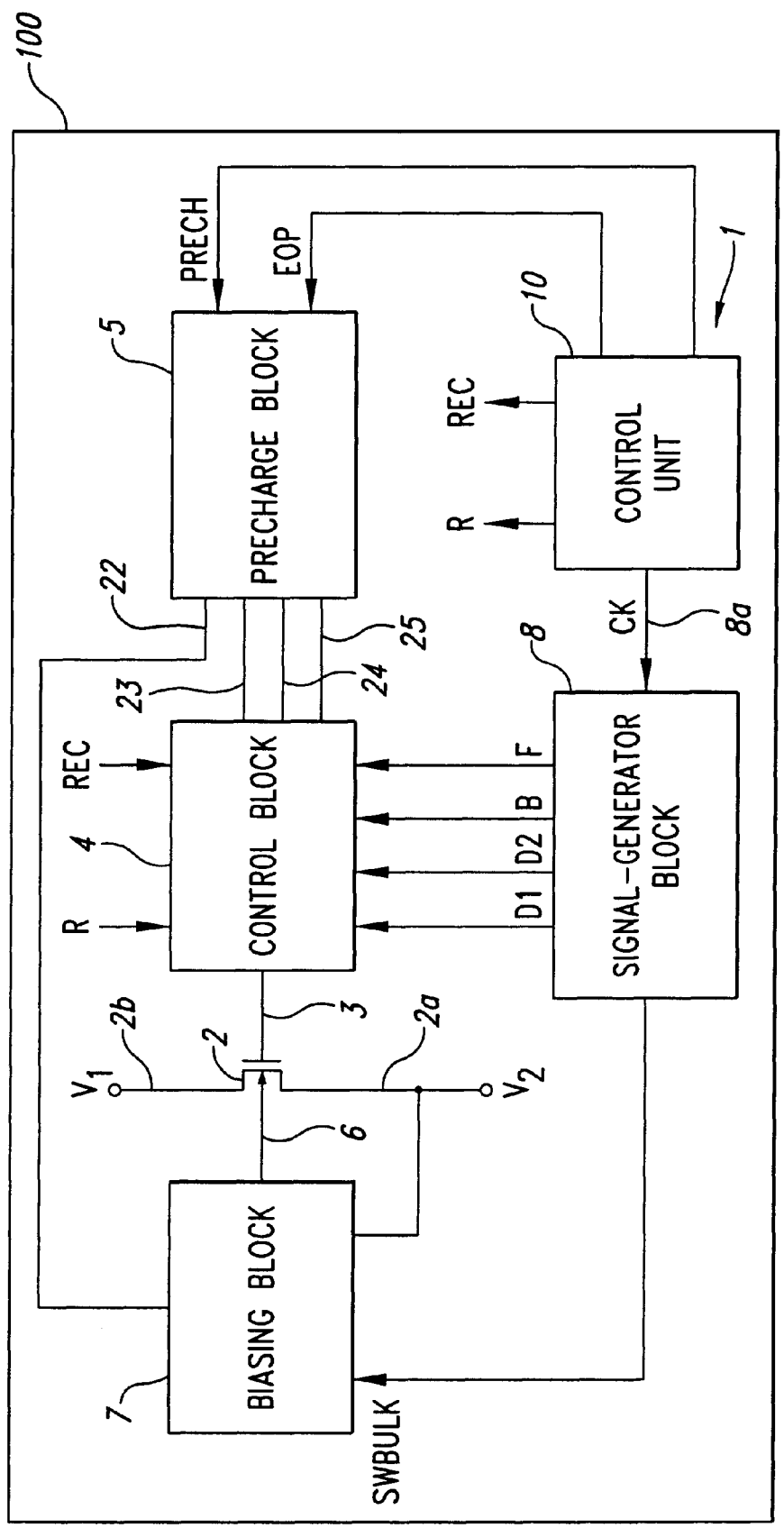
FIG. 1 is a block diagram of a high-voltage bidirectional switch made according to the invention.

FIG. 1 shows a high-voltage bidirectional switch I included in a storage device 100 and, more in particular, in a voltage-boosting device set inside the storage device 100. An embodiment of this voltage-boosting device is described in EP-0 836 268. In particular, the high-voltage bidirectional switch 1 is used to enable transfer of charge between the various charge-storage capacitors included in the voltage-boosting device. The high-voltage bidirectional switch comprises an NMOS controlled transistor 2 having a first terminal 2b set at a first potential $V_1$ (for example, the potential present on an output node of the voltage-boosting device) and a second terminal 2a set at a second potential $V_2$ (for example, the potential present across one of the charge-storage capacitors included in the voltage-boosting device). The controlled transistor 2 further comprises a control terminal 3 connected to a control block 4, -which is in turn connected to a precharge block 5. Advantageously, the controlled transistor 2 is made in triple well and has a bulk region 6 connected to a biasing block 7, which is in turn connected both to the precharge block 5 and to the second terminal 2a of the controlled transistor 2. The control block 4 and the biasing block 7 are moreover connected to a signal-generator block 8. The latter is a logic circuit of a generally known type, having an input 8a receiving a clock signal CK generated by a control unit 10, and five outputs supplying a first discharge signal D1, a second discharge signal D2, a third discharge signal F, a boost signal B, and a biasing signal SWBULK. These five signals are logic signals switching between a voltage value $V_{DD}$ (for example, the positive supply voltage of the storage device 100) and 0 V. In addition, the duration of these signals must be compatible with the value of the time constant RC associated to the charging/discharging of the circuit nodes present inside the high-voltage bidirectional switch 1.

Figure 2:
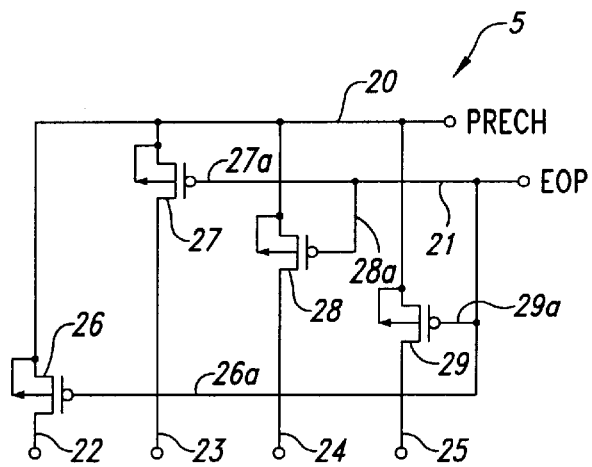
FIG. 2 presents a circuit diagram of one of the blocks of FIG. 1 in greater detail.

With reference to FIG. 2, the precharge block 5 has a first input terminal 20 and a second input terminal 21 receiving, respectively, a precharge signal PRECH and a deactivation signal EOP, generated by the control unit 10. Both these signals switch between a high voltage $V_{high}$ (which represents the positive supply voltage of the storage device 100, or, alternatively, a voltage stored in a charge-storage capacitor) and 0 V, and a first output terminal 22, a second output terminal 23, a third output terminal 24, and a fourth output terminal 25. In greater detail, the precharge block 5 comprises a first PMOS precharge transistor 26, a second PMOS precharge transistor 27, a third PMOS precharge transistor 28, and a fourth PMOS precharge transistor 29, which have their respective gate terminals 26a, 27a, 28a, and 29a connected to the second input terminal 21 of the precharge block 5, their respective source and bulk terminals that are short-circuited together and are connected to the first input terminal 20 of the precharge block itself, and their drain terminals that are connected, respectively, to the first, second, third and fourth output terminals 22, 23, 24, 25.

Figure 3:
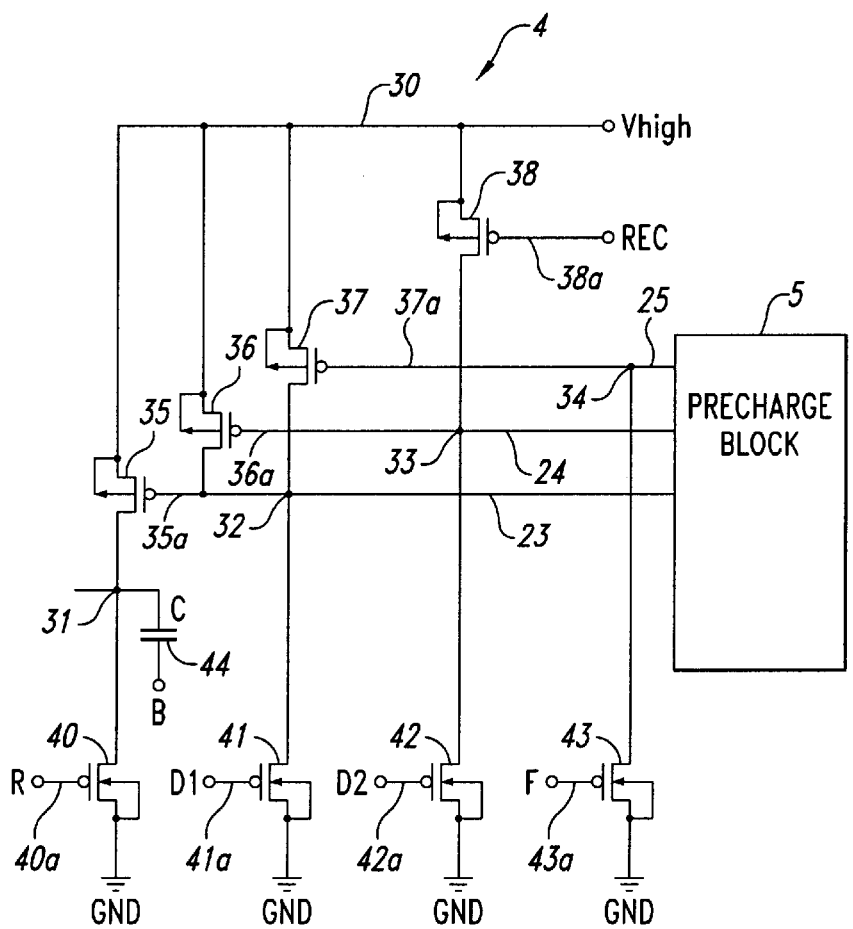
FIG. 3 shows a more complete circuit diagram of another block of FIG. 1.

With reference now to FIG. 3, the control terminal 4 comprises a high-voltage terminal 30 set at the high voltage $V_{high}$, and an output node 31 connected to the control terminal 3 of the controlled transistor 2.

The control block 4 further comprises a first charge node 32, a second charge node 33, and a third charge node 34, which are connected, respectively, to the second, third and fourth output terminals 23, 24 and 25 of the precharge block 5, and a first PMOS charge transistor 35, a second PMOS charge transistor 36, a third PMOS charge transistor 37, and a fourth PMOS charge transistor 38. In detail, the first charge transistor 35 has its drain terminal connected to the output node 31, its source terminal and bulk terminal short-circuited together and connected to the high-voltage terminal 30, and its gate terminal 35a connected to the first charge node 32. The second charge transistor 36 has its drain terminal connected to the first charge node 32, its source terminal and bulk terminal short-circuited together and connected to the high-voltage terminal 30, and its gate terminal 36a connected to the second charge node 33. The third charge transistor 37 has its drain terminal connected to the first charge node 32, its source terminal and bulk terminal short-circuited together and connected to the high-voltage terminal 30, and its gate terminal 37a connected to the third charge node 34. Finally, the fourth charge transistor 38 has its drain terminal connected to the second charge node 33, its source terminal and bulk terminal short-circuited together and connected to the high-voltage terminal 30, and its gate terminal 38a receiving a charge signal REC generated by the control unit 10 and switching between $V_{high}$ and 0 V. The control block 4 moreover comprises an isolation transistor 40 having its drain terminal connected to the output node 31, its source terminal and bulk terminal short-circuited together and connected to the ground potential GND, and its gate terminal 40a receiving a reset signal R which is also generated inside the storage device 100. The control block 4 further comprises: a first discharge transistor 41 having its drain terminal connected to the first charge node 32, its source terminal and bulk terminal short-circuited together and connected to the ground potential GND, and its gate terminal 41a receiving the first discharge signal D1; a second discharge transistor 42 having its drain terminal connected to the second discharge node 33, its source terminal and bulk terminal short-circuited together and connected to the ground potential GND, and its gate terminal 42a receiving the second discharge signal D2; a third discharge transistor 43 having its drain terminal connected to the third charge node 34, its source terminal and bulk terminal short-circuited together and connected to the ground potential GND, and its gate terminal 43a receiving the third discharge signal F. The isolation transistor 40 and the discharge transistors 41, 42 and 43 are NMOS transistors.

The control block 4 also comprises a boost capacitor 44 having a first terminal connected to the output node 31 and a second terminal receiving the boost signal B.

Figure 4:
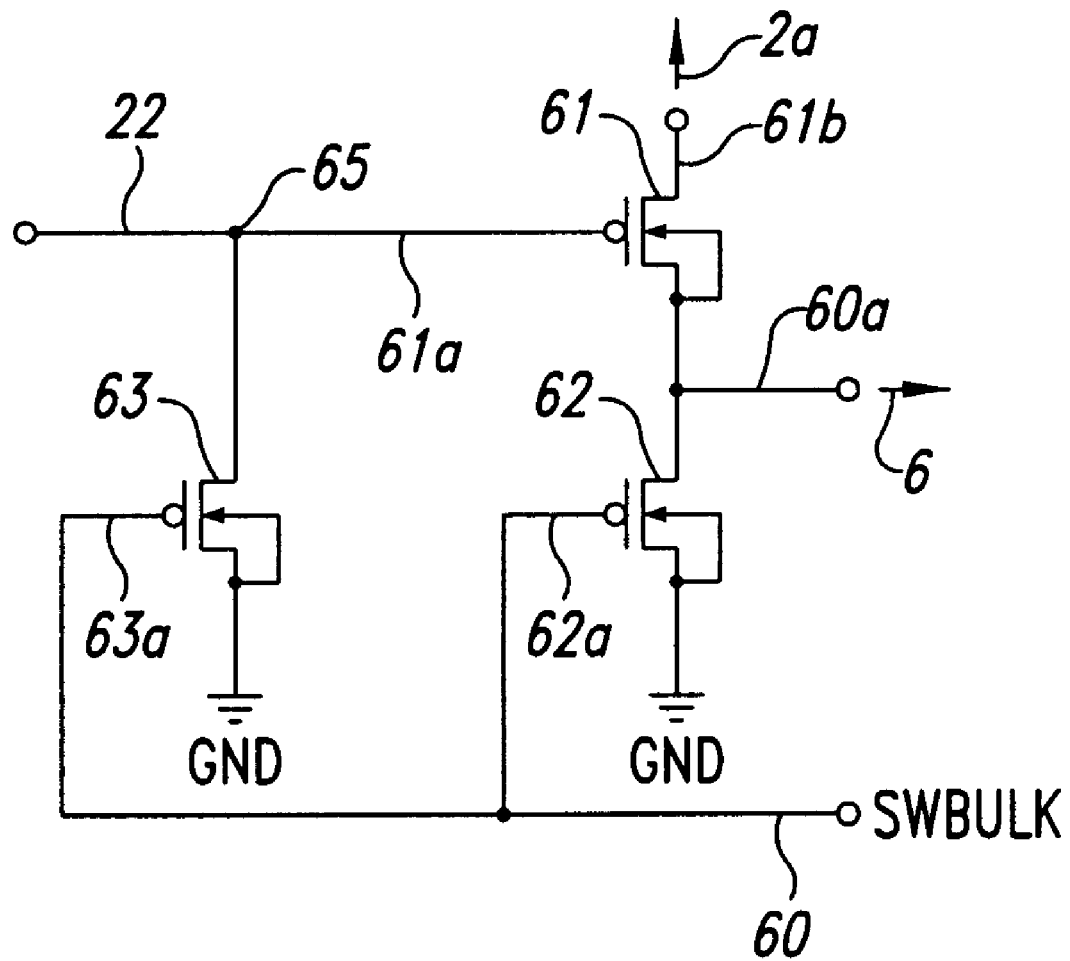
FIG. 4 shows a more complete circuit diagram of yet another block of FIG. 1.

With reference to FIG. 4, the biasing block 7 has an input terminal 60 receiving the biasing signal SWBULK and an output terminal 60a connected to the bulk region 6 of the controlled transistor 2.

In greater detail, the biasing block 7 comprises a first NMOS biasing transistor 61 and a second NMOS biasing transistor 62 which are connected together in series between the output terminal 60a of the biasing block 7 and the ground potential GND. In particular, the first biasing transistor 61 has its drain terminal 61b connected to the second terminal 2a of the controlled transistor 2, its bulk terminal and source terminal short-circuited together and connected to the output terminal 60a of the biasing block 7, and its gate terminal 61a connected to a circuit node 65, which is in turn connected to the first output terminal 22 of the precharge block 5. The second biasing transistor 62 has its drain terminal connected to the output terminal 60a of the biasing block 7, its bulk terminal and source terminal short-circuited together and connected to the ground potential GND, and its gate terminal 62a receiving the biasing signal SWBULK. The biasing block 7 moreover comprises a third biasing transistor 63 having its drain terminal connected to the circuit node 65, its bulk terminal and source terminal short-circuited together and connected to the ground potential GND, and its gate terminal 63a receiving the biasing signal SWBULK.

In particular, the biasing block 7 makes it possible to bias the bulk region 6 of the controlled transistor 2 in a way whereby the following two constraints are met: First, the bulk region 6 of the controlled transistor 2 is biased at a voltage value not higher than the minimum potential present on the drain terminal or on the source terminal of the controlled transistor itself, in order to prevent direct biasing of the bulk-source and bulk-drain junctions.

Second the bulk region 6 of the controlled transistor 2 is not biased at a voltage value that is too low, in order to reduce as much as possible the body effect (i.e., the dependence of the threshold voltage on the source-to-body voltage drop) and thus to maintain adequate conductivity of the controlled transistor 2 even at high voltages.

Operation of the bidirectional switch 1 is described in what follows.

Initially, consider the condition in which the first potential $V_1$ is higher than the second potential $V_2$ (bidirectional switch 1 which transfers charge in a first direction), the output node 31 is set at ground potential GND, the charge signal REC and precharge signal PRECH are at a high level, and the deactivation signal EOP is at a low level. The low level of the deactivation signal EOP enables turning-on of the precharge transistors 26, 27, 28 and 29 and precharging of the circuit node 65 and of the charge nodes 32, 33 and 34 at the high voltage $V_{high}$ present on the first input terminal 20 of the precharge block 5 (precharge signal PRECH at a high level). Once precharge of these nodes is completed, the deactivation signal EOP switches to the high level, so causing turning-off of the precharge transistors 26, 27, 28 and 29 and isolation of the circuit node 65 and of the charge nodes 32, 33 and 34 from the first input terminal 20 of the precharge block 5.

In this condition, the charge transistors 35, 36, 37 and 38 turn off, and no conductive path is present between the high-voltage terminal 30 and the charge nodes 32, 33 and 34, and between the high-voltage terminal 30 and the output node 31. Since the latter is connected to the ground potential GND, it causes turning-off of the controlled transistor 2.

In addition, the biasing signal SWBULK is at a low level, so that the second biasing transistor 62 and the third biasing transistor 63 are off, whilst the first biasing transistor 61 is on, in that the circuit node 65 is precharged at the high voltage $V_{high}$. In this condition, the bulk region 6 of the controlled transistor 2 is biased at the second potential $V_2$ present on the second terminal 2a of the controlled transistor 2, minus the threshold voltage of the first biasing transistor 61. Given that the potential $V_2$ present on the second terminal 2a is higher than the potential $V_1$ on the first terminal 2b of the controlled transistor 2, the second terminal 2a operates as a source terminal, so that the bulk region 6 is biased in order to meet the constraints specified previously.

Figure 5:
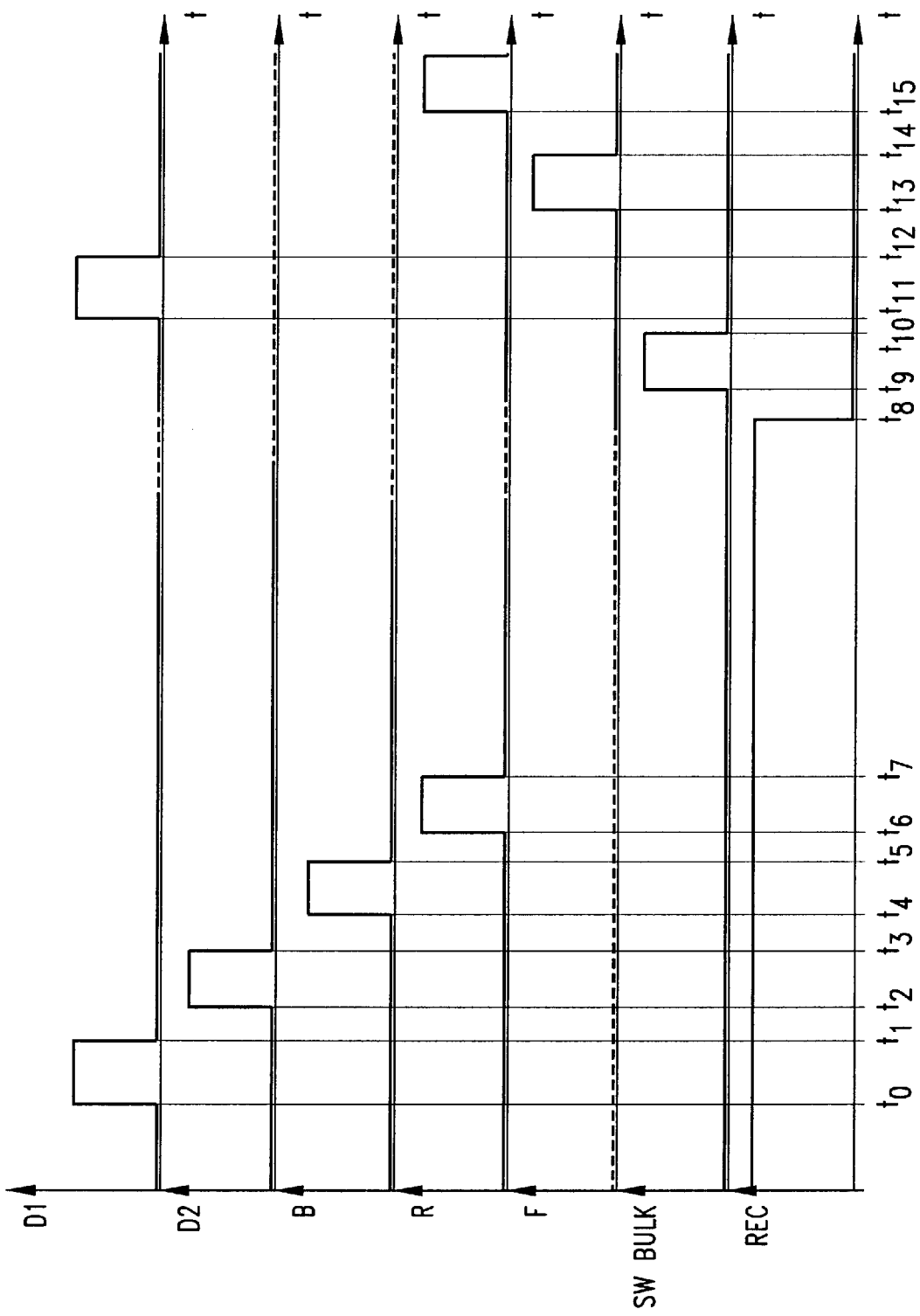
FIG. 5 shows the patterns of signals used by the circuit of FIG. 1.

With reference now to FIG. 5, when the first discharge signal D1 switches from the low level to the high level (instant $t_0$), the first discharge transistor 41 turns on, thus enabling discharge of the first charge node 32 to ground voltage GND. This causes turning-on of the first charge transistor 35 and charging of the output node 31 at the high voltage $V_{high}$, with consequent turning-on of the controlled transistor 2.

The first discharge signal then switches from the high level to the low level (instant $t_1$), so causing turning-off of the first discharge transistor 41 and isolation of the first charge node 32 from the ground potential GND.

At instant $t_2$, the second discharge signal D2 switches from the low level to the high level, so causing turning-on of the second discharge transistor 42. The second charge node 33 thus discharges to ground potential GND, so enabling turning-on of the first charge transistor 36 and c of the second charge node 32 at the high voltage $V_{high}$. This causes turning-off of the first charge transistor 35 and electrical isolation of the output node 31 both from the high-voltage terminal 30 and from the ground potential GND (since also the isolation transistor 40 is off).

Subsequently (instant $t_3$), the second discharge signal D2 switches to the low level, so enabling turning-off of the second discharge transistor 42 and isolation of the second charge node 33 from the ground potential GND.

In this condition, in order to increase the conductivity of the controlled transistor 2, and thus enable transfer of high voltages in a reasonable time, on the control terminal 3 of the controlled transistor 2 a "miniboost" is obtained by means of the boost capacitor 44 and the boost signal B. In particular, at instant $t_4$, the boost signal B switches from the low level to the high level, thus causing charging of the boost capacitor 44 and boosting of the voltage present on the control terminal 3 of the controlled transistor 2. In this way, the conductivity of the controlled transistor 2 is increased because its overdrive voltage increases (the latter being defined as the difference between the gate-to-source voltage and the threshold voltage of the controlled transistor itself). In order to increase the conductivity of the controlled transistor 2 adequately, the boost capacitor 44 must have a capacitance value higher by at least one order of magnitude than the capacitance value present on the control terminal 3 of the controlled transistor 2.

The miniboost terminates when the boost signal B switches from the high level to the low level (instant $t_5$).

At instant $t_6$, the reset signal R switches from the low level to the high level, thus enabling turning-on of the isolation transistor 40 and discharge of the output node 31 to ground potential GND. This causes turning-off of the controlled transistor 2.

The reset signal R then switches from the high level to the low level (instant $t_7$), so causing turning-off of the isolation transistor 40 and isolation of the output node 31 from the ground potential GND.

Subsequently (instant $t_8$), the charge signal REC switches from the high level to the low level, thus causing turning-on of the fourth charge transistor 38 and charging of the second charge node 33 at the high voltage $V_{high}$. The first circuit node 32 is also charged at the high voltage $V_{high}$ and is electrically isolated from the high-voltage terminal 30 since the third charge transistor 37 is off (third charge node 34 precharged at the high voltage $V_{high}$).

Now suppose that the first potential $V_1$ is lower than the second potential $V_2$ (bidirectional switch 1 which transfers charge in a second direction opposite to the previous direction).

In this condition (instant $t_9$), the biasing signal SWBULK switches from the low level to the high level, thus causing turning-on of the second and third biasing transistors 62, 63. In particular, turning-on of the third biasing transistor 63 enables discharging of the circuit node 65 to ground potential GND and turning-off of the first biasing transistor 61. At the same time, turning-on of the second biasing transistor 62 enables biasing of the bulk region 6 of the controlled transistor 2 at ground potential GND. In this case, in fact, it is no longer possible to bias the bulk region 6 at the second potential $V_2$ since the latter is higher than the first potential $V_1$ (in fact in this case the constraint would not be met of having the bulk region 6 biased at the minimum potential present on the drain terminal or on the source terminal of the controlled transistor itself).

The biasing signal SWBULK then switches from the high level to the low level (instant $t_{10}$), thus causing turning-off of the second and third biasing transistors 62, 63 and isolation of the bulk region 6.

Subsequently (instant $t_{11}$), the first discharge signal D1 switches again from the low level to the high level, thus causing turning-on of the first discharge transistor 41 and discharge of the first charge node 32 to ground potential GND. In a way similar to the one described previously, the first charge transistor 35 turns on, and the output node 31 is charged at the high voltage $V_{high}$, thus enabling turning-on of the controlled transistor 2.

At instant $t_{12}$, the first discharge signal D1 switches from the high level to the low level, thus causing turning-off of the first discharge transistor 41 and isolation of the first charge node 32 from the ground potential GND.

At instant $t_{13}$, the third discharge signal F switches from the low level to the high level, thus enabling turning-on of the third discharge transistor 43 and discharging of the third charge node 34 to ground potential GND. This causes turning-on of the third charge transistor 37 and charging of the first node 32 at the high voltage $V_{high}$, so enabling turning-off of the first charge transistor 35. The output node 31 is thus isolated from the high-voltage terminal 30.

At instant $t_{14}$, the third discharge signal F switches from the high level to the low level, so enabling turning-off of the third discharge transistor 43 and isolation of the third charge node 34 from ground potential GND.

Subsequently (instant $t_{15}$), the reset signal R switches from the low level to the high level, so causing turning-on of the isolation transistor 40 and discharging of the output node 31 to ground potential GND. This causes turning-off of the controlled transistor 2.

In order to increase further the efficiency of the bidirectional switch 1, the biasing block 7 can be designed in such a way as to guarantee that, for each operating condition of the bidirectional switch 1, there will always be a potential difference between the source terminal and the bulk region of the controlled transistor 2. In particular, in the condition in which the first potential $V_1$ is lower than the second potential $V_2$, the first terminal 2b of the controlled transistor 2 operates as a new source terminal, and the biasing block 7 biases the bulk region 6 at the voltage $V_1$.

In addition, between instant $t_{14}$ and instant $t_{15}$ a further miniboost may be implemented by means of the boost capacitor 44 and the boost signal B, in a similar way as described previously.

The advantages obtainable with the bidirectional switch described herein are illustrated below. In the first place, the bidirectional switch 1 has somewhat reduced production costs, in that it is implemented using exclusively conventional high-power MOS transistors. In this way it is not necessary to adopt somewhat complex technological solutions that depend upon the integration process, as in known bidirectional switches.

In addition, the bidirectional switch according to the invention presents reduced dissipation in the dynamic state in that it is not made using voltage-level translator devices.

Furthermore, the use of the miniboost for boosting the voltage on the control terminal 3 of the controlled transistor 2, together with the use of the biasing,g block 7, enables zeroing of the Threshold voltage loss that NMOS transistors present in the case where they are required to transfer high voltages, as well as ensuing bidirectionality of the high-voltage switch 1. Finally, it is clear that numerous modifications and variations may be made to the high-voltage bidirectional switch described herein, all falling within the scope of the inventive idea, as defined in the attached claims.

What is claimed is:

1. A high voltage bidirectional switch comprising:
   a pass gate having a control terminal;
   a first line at a first reference potential;
   a second line at a second reference potential;
   a first MOS switch connected between said first line at said first reference potential and said control terminal, and having a control terminal of its own connected to a first node and receiving a control voltage, said first MOS switch being closed in the presence of a first value and open in the presence of a second value of said control voltage;
   a second MOS switch connected between said second line at said second reference potential and said control e and having a control terminal of its own;
   a first memory circuit having an activation input, and an output connected to said first node, said memory circuit generating said first value of said control voltage;
   a second memory circuit having an activation input, and an output connected to said first node, said second memory circuit generating said second value of sad control voltage; and
   a control unit sending in sequence and cyclically: a first pulse signal to said activation input of said first memory circuit to control activation of said memory circuit, storage of said first value of said control voltage on said first node, connection of said control terminal of said pass gate to said first line at a first reference potential, and storage of said first reference potential on said control tonal of said pass gate; a second pulse signal to said activation input of said second memory circuit to control activation of said second memory circuit, and storage of said second value of said control voltage on said first node; and a third pulse signal to said second MOS switch to control closing of said second MOS switch, and storage of said second reference potential at said control terminal of said passgate.

2. The switch according to claim 1, in which said first memory circuit comprises a first MOS transistor having a control terminal of its own connected to said activation input of said first memory circuit, and in which said second memory, circuit comprises a second MOS transistor connected between said first line at said first reference potential and said first node, and having a control terminal of its own connected to a second control node; and a third MOS transistor connected between said second line at said second reference potential and said second node, and having a control terminal of its own connected to said activation input of said second memory circuit.

3. The switch according to claim 1, comprising a biasing block connected between a terminal of said pass gate set at a third potential and said second line at said second reference potential, said biasing block having a biasing input which receiving a biasing signal generated by said control unit, a biasing output connected to a bulk region of said pass gate, and a circuit node,
   said biasing block biasing said bulk region of said pass gate at said third potential when said control unit generates said biasing signal at a first value and on said circuit node there is stored said first value of said control voltage, then biasing said bulk region of said pass gate at said second potential when said control unit generates said biasing signal at a second value and on said circuit node there is stored said second value of said control voltage.

4. The switch according to claim 3, in which said biasing block comprises:
   a first MOS biasing transistor connected between said terminal of said pass gate and said biasing output, said first biasing transistor having a control terminal of its own connected to said circuit node;
   a second MOS biasing transistor connected between said biasing output and said second line, said second biasing transistor having a control terminal of its own receiving said biasing signal; and
   a third biasing transistor connected between said terminal of said pass gate and said second line, said third biasing transistor having a control terminal of its own receiving said biasing signal.

5. The switch according to any of the foregoing claims, further comprising a precharge block having a first precharge input receiving said control voltage at said first value and a second precharge input receiving a control signal generated by said control unit, and at least one first, one second and one third precharge output which are connected, respectively, to said first control node, to said second control node, and to said circuit node, said precharge block comprising:
   a first MOS precharge transistor connected between said first precharge input and said first control node, and having a control terminal of its own connected to said second precharge input;
   a second MOS precharge transistor connected between said first precharge input and said second control node, and having a control terminal of its own connected to said second precharge input; and a third MOS precharge transistor connected between said first precharge input and said circuit node, and having a control terminal of its own connected to said second precharge input;

said control mint sending to said second precharge input said control signal at a first value to control activation of said first, second and third precharge transistors, and to control storage of said first value of said control voltage on said first and second control nodes and on said circuit node, then sending said control signal at a second value to control closing of said first, second and third precharge transistors.

6. The switch according to claim 1, comprising a capacitive element having a fits terminal connected to said control terminal of said pass gate and a second terminal receiving a boost signal generated by said control unit, said control unit sending said boost signal subsequently to said second pulse signal, said boost signal boosting said first value of said control voltage on said control terminal of said pass gate.

7. A method for driving a high-voltage bidirectional switch, comprising:

sending a first pulse signal to an activation input of a first memory circuit, activating said first memory circuit;

storing a first control voltage value on a first node;

connecting, in the presence of said first control voltage value on said first node, a control terminal of a pass gate to a first line at a fast reference potential, and storing said first reference potential on said control terminal of said pass gate;

sending a second pulse signal to an activation input of a second memory circuit, activating said second memory circuit;

storing a second control voltage value on said first node;

disconnecting, in the presence of said second control voltage value on said first node, said control terminal of sad pass ate from said first line at said first reference potential;

sending a third pulse signal to a second MOS switch;

closing said second MOS switch;

connecting said control terminal of said pass gate to a second line at a second reference potential; and storing said second reference potential on said control terminal of said pass gate.

8. A high-voltage bidirectional switch comprising:

a first line at a first reference potential;

a second line at a second reference potential;

a pass gate having a first conduction terminal at a first voltage potential, a second conduction terminal at a second voltage potential, and a control terminal, said pass gate operating in a conduction mode in the presence of said first reference potential at said control terminal, and operating in a non-conduction mode in the presence of said second reference potential at said control terminal;

a first MOS switch connected between said first line at said first reference potential and said control terminal, and having a control terminal of its own connected to a first node and receiving a control voltage, said first MOS switch being closed in the presence of a first value and open in the presence of a second value of said control voltage;

a second MOS switch connected between said second line at said second reference potential and said control terminal and having a control terminal of its own connected to a second node and receiving a second control voltage, said second MOS switch being open in the presence of a first value and closed in the presence of a second value of said second control voltage;

a biasing block connected between said first conduction terminal of said pass gate and said second lie at said second reference potential, said biasing block having a biasing input which receives a biasing signal, and a biasing output connected to a bulk region of said pass gate, said biasing block biasing said bulk region of said pass gate at said fist voltage potential when said biasing signal is at a first value, and biasing said bulk region of said pass gate at said second reference potential when said biasing signal is at a second value; and a control circuit having a first output terminal connected to said first node, a second output terminal connected to said second node, and a biasing terminal connected to said biasing input of said biasing block, the control circuit generating said first control voltage at said first output terminal, said second control voltage at said second output terminal and said biasing signal at said biasing terminal.

9. The switch according to claim 8, comprising a capacitive element having a fits terminal connected to said control terminal of said pass gate and a second terminal receiving a boost signal generated by said control circuit, said boost signal boosting said first value of said control voltage on said control terminal of said pass gate.

* * * * *

UNITED STATES PATENT AND TRADEMARK OFFICE
CERTIFICATE OF CORRECTION

PATENT NO.    : 6,288,603 B1
DATED         : September 11, 2001
INVENTOR(S)   : Mauro Zanuccoli et al.

It is certified that error appears in the above-identified patent and that said Letters Patent is hereby corrected as shown below:

Column 7, claim 1,
Line 52, "and said control e" should read as -- and said control terminal, --.
Line 60, "value of sad" should read as -- value of said --.

Column 8, claim 1,
Line 2, "said control tonal" should read as -- said control terminal --.

Column 8, claim 2,
Line 13 and 14, "second memory, circuit" should read as -- second memory circuit --.

Column 9, claim 5,
Line 7, "said control mint" should read as -- said control unit --.

Column 9, claim 7,
Line 40, "sad pass ate" should read as -- said pass gate --.

Column 10, claim 8,
Line 26, "said second lie" should read as -- said second line --.

Signed and Sealed this

Twenty-sixth Day of March, 2002

*Attest:*

JAMES E. ROGAN
*Attesting Officer*   *Director of the United States Patent and Trademark Office*